United States Patent [19]

Shinozaki

[11] Patent Number: 4,476,157
[45] Date of Patent: Oct. 9, 1984

[54] METHOD FOR MANUFACTURING SCHOTTKY BARRIER DIODE

[75] Inventor: Satoshi Shinozaki, Yokohama, Japan

[73] Assignee: Tokyo Shibaura Denki Kabushiki Kaisha, Japan

[21] Appl. No.: 402,541

[22] Filed: Jul. 28, 1982

[30] Foreign Application Priority Data

Jul. 29, 1981 [JP] Japan .................................. 56-117657
Aug. 10, 1981 [JP] Japan .................................. 56-124124

[51] Int. Cl.$^3$ ............................................ H01L 21/24
[52] U.S. Cl. ....................................... 427/84; 148/1.5;
148/187; 29/576 B; 427/89; 427/90; 427/93; 427/94
[58] Field of Search .......................... 427/84, 89, 90, 93, 427/94; 148/187, 1.5; 29/576 B

[56] References Cited

U.S. PATENT DOCUMENTS 4,128,670 12/1978 Gaensslen ............................. 427/88
4,313,971 2/1982 Wheatley ............................. 427/84
4,364,166 12/1982 Crowder ............................. 148/187
4,375,999 3/1983 Nawata ............................. 148/187

OTHER PUBLICATIONS

Gniewek et al., "Enhancement of Pt Adhesion Using a Silicon Underlay" IBM TDB, vol. 20, No. 3, p. 1009, Aug. 1977.
Rideout, "Reducing the Sheet Resistance of Polysilicon Lines in Integrated Circuits", IBM TDB, vol. 17, No. 6, pp. 1831–1832, Nov. 1974.
Sullivan, "Evaporated Metal Schottky Barrier Diode" IBM TDB, vol. 21, No. 7, p. 2816, Dec. 1978.

Primary Examiner—John D. Smith
Attorney, Agent, or Firm—Finnegan, Henderson, Farabow, Garrett & Dunner

[57] ABSTRACT

Disclosed is a method for manufacturing a Schottky barrier diode. An insulating film is formed on a silicon substrate of one conductivity type. The insulating film has a hole therein partially exposing the surface of the silicon substrate. Then, a polycrystalline silicon layer is formed to cover that portion of the insulating film which surrounds the contact hole, the inner wall of the contact hole, and the exposed surface portion of the silicon substrate. Thereafter, a metal layer is deposited to cover at least the polycrystalline silicon layer. The polycrystalline silicon is then alloyed with the metal to form a metal silicide layer.

15 Claims, 11 Drawing Figures

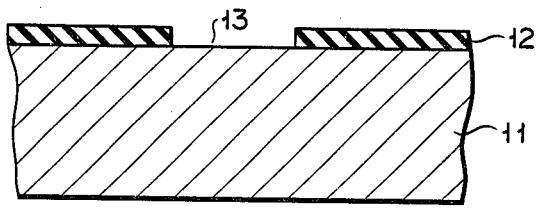
F I G. 1A
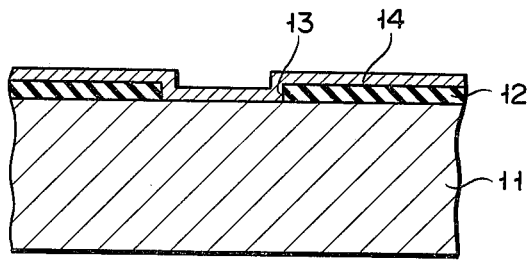
F I G. 1B
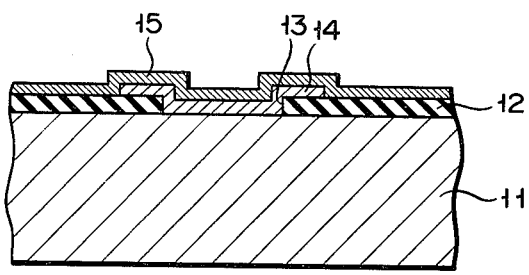
F I G. 1C
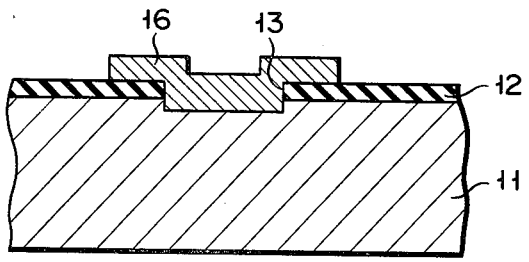
F I G. 1D
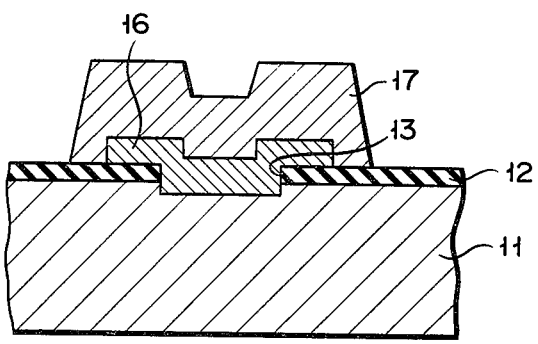
F I G. 1E

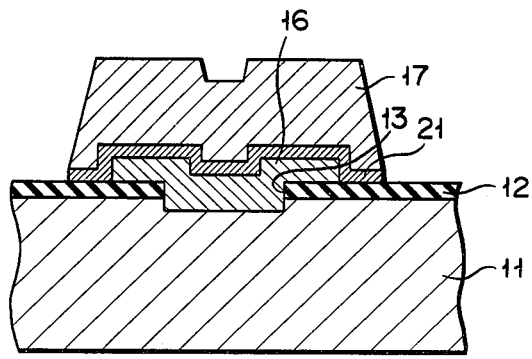
F I G. 2
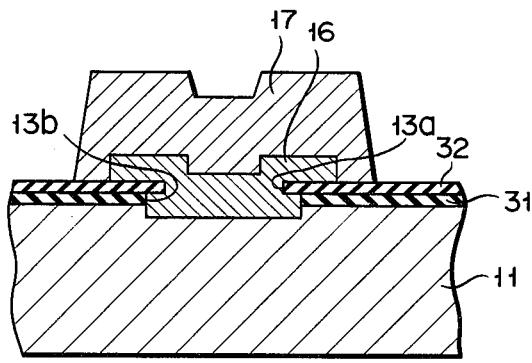
F I G. 3
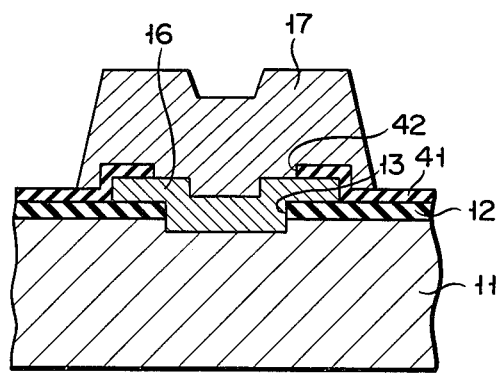
F I G. 4

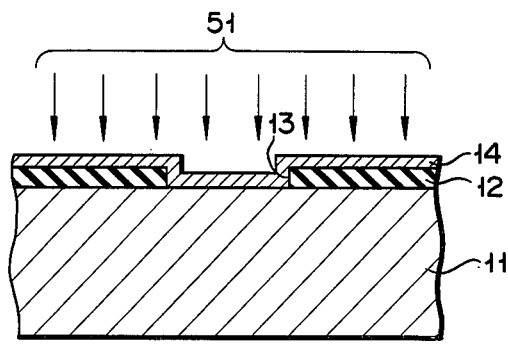
FIG. 5A
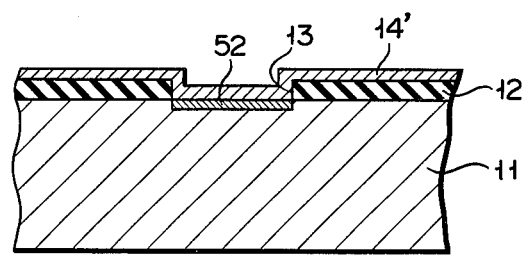
FIG. 5B
FIG. 6
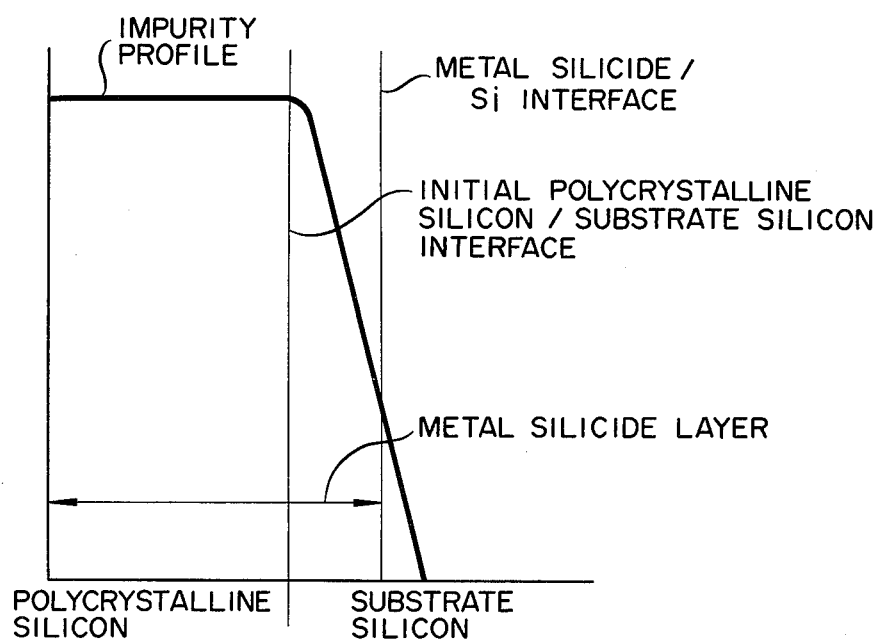

METHOD FOR MANUFACTURING SCHOTTKY BARRIER DIODE

BACKGROUND OF THE INVENTION

I. Field of the Invention

The present invention relates to a method for manufacturing a Schottky barrier diode.

II. Description of the Prior Art

A Schottky barrier diode (SBD) is based on a rectifying barrier (Schottky barrier) formed by contact between a metal and a semiconductor. Since injection of the minority carriers does not substantially occur and a forward bias voltage thereof is smaller than that of a p-n junction diode, the SBD has been widely used as a high-speed clamping diode for the p-n junction diode. A Schottky barrier diode clamped npn transistor is a typical example of such application. TTL circuits with the npn transistor of this type are most widely used as high-speed logic circuits.

In order to manufacture the SBD of this type, a contact hole is formed in, for example, a silicon dioxide insulating film formed on an n-type silicon substrate, exposing a surface portion of the substrate. A metal is deposited on the silicon dioxide layer and the exposed portion of the n-type silicon substrate. Annealing is then performed to alloy the surface silicon of the substrate with the metal. Thus a metal silicide layer is formed. The metal layer portions remaining on the surface of the silicon dioxide layer and on the inner wall of the contact hole are removed, leaving the silicide layer. Finally, a wiring metal layer is deposited on the remaining silicide layer and the silicon dioxide layer portion near around the contact hole.

If aluminum is used as the wiring metal layer, the silicide layer need not be performed, and aluminum may be directly deposited as the wiring metal layer on the exposed surface of the n-type silicon substrate. Thereafter, annealing is performed to alloy part of the aluminum layer with the substrate silicon. Thus, the desired silicide layer can be obtained. However, in this case, the silicon substrate must have the (111) plane on the surface so as not to form alloy pits between aluminum and silicon.

Independently of the Miller index of the silicon substrate, platinum can be used to form a desired silicide layer by alloying with silicon. Since platinum silicide reacts with aluminum used for the wiring metal layer which is formed later on, electrical characteristics of platinum silicide are inadvertently changed. In order to prevent this reaction, a reaction preventing metal such as titanium and tungsten must be deposited on platinum silicide before aluminum is deposited thereon. If such a countermeasure is taken for platinum silicide, a highly reliable SBD can be obtained. Thus, platinum silicide has been recently used frequently in place of aluminum silicide.

However, in the above method for manufacturing the SBD with a platinum silicide layer, silicon in the platinum silicide layer is oxidized by aqua regia used to pattern the platinum silicide, i.e., to remove the platinum, resulting in the formation of a thin silicon dioxide layer on the platinum silicide layer. If hydrofluoric acid is used which is effective for etching silicon dioxide, it etches not only the silicon dioxide on the platinum silicide layer, but also the silicon dioxide defining the inner wall of the contact hole. As a result, the surface part of the silicon substrate which is not alloyed with the platinum is newly exposed. Subsequently, if the reaction preventing metal is deposited, it directly contacts the newly exposed surface portion of the silicon substrate. Thus, in the resulting structure, an SBD formed by platinum silicide and silicon and an SBD formed by the reaction preventing metal and silicon constitute a parallel diode. The barrier height $\phi_B$ of the structure as a whole and hence the forward bias voltage $V_F$ vary depending on the area of the newly exposed portion of the silicon substrate. Since the area can hardly be kept constant, the forward characteristics cannot be obtained with good reproducibility. Further, the SBDs obtained by the above method may vary in a reverse breakdown voltage.

In order to eliminate the above drawback, it has been practised to form a guard ring, which constitutes the p-n junction with the substrate, in the portion of the silicon substrate corresponding to the surrounding region of the contact hole formed in the insulating film. The forward and reverse characteristics are thus improved. However, when the guard ring is formed, the packing density of the SBD is lowered. The SBD of this type is not suitable for an internal element of a highly integrated device. Thus, the SBD is only used in a transistor or diode of an input/output section.

The forward current J of an SBD is expressed as follows:

$$J = J_S \exp((qV_F/nKT) - 1)$$

where $J_S$ is the saturation current expressed by $A^*T^2 \exp(-q\phi_B/KT)$, $V_F$ is the forward voltage, K is the Boltzmann's constant, n is the constant representing the junction state, $A^*$ is the effective Richardson's constant, q is the electric charge, T is the temperature, and $\phi_B$ is the barrier height. As is apparent from the above equation, in an SBD, if the barrier height $\phi_B$ is great, the saturation current $J_s$ becomes small and the forward voltage $V_F$ is high. However, if the barrier height $\phi_B$ is decreased, the saturation current $J_s$ is increased and the effective forward voltage $V_F$ is dropped. Therefore, when the barrier height $\phi_B$ is controlled with high precision, the forward characteristics of the SBD can be highly precisely controlled.

In order to control the barrier height of the SBD, a method is proposed in J. B. Bindell et al, "IEEE Trans ED", Vol. ED-27, No. 2, P. 420, 1980. According to this method, the electric field strength is extremely increased in the vicinity of the semiconductor substrate surface by ion-implanting an impurity at a high concentration so as to cause a tunneling effect, whereby the barrier height is substantially decreased. The barrier height is thus controlled by the dose of ion-implantation. For example, when phosphor is ion-implanted at a dose of 0 to $1 \times 10^{13}$ cm$^{-2}$ and at an acceleration voltage 35 KeV, the forward voltage $V_F$ can be changed in a range of 0.4 to 0.1 eV. However, it is described in the above article that the reverse voltage $V_R$ is not substantially dropped as opposed to the change in the forward voltage $V_F$ from 0.4 to 0.25 eV.

However, according to the method just described, if annealing is performed to cure the damage to the semiconductor substrate surface which may be caused by ion-implantation, the doped impurity ions may be diffused to form a new impurity profile. The desired impurity profile determined by the ion-implantation conditions cannot be maintained. Further, since the SBD is basically manufactured by the method described above, the etching of the inner wall of the contact hole in the insulating film remains unsolved.

SUMMARY OF THE INVENTION

It is, therefore, an object of the present invention to provide a method for manufacturing a Schottky barrier diode (SBD) with highly stable characteristics and good reproducibility.

It is another object of the present invention to provide an SBD suitable for micronization without forming a guard ring.

It is still another object of the present invention to provide a method for maufacturing an SBD without forming a parallel diode.

It is still another object of the present invention to provide a method for manufacturing an SBD which is capable of arbitrarily controlling a forward voltage.

According to the present invention, a silicon substrate or layer of one conductivity type is covered with an insulating film which has a contact hole partially exposing the substrate surface, and a polycrystalline silicon layer is formed on at least that portion of the insulating film surrounding the contact hole, an inner wall of the contact hole and the exposed surface portion of the silicon substrate. A metal layer is then deposited to cover at least the polycrystalline silicon layer. Then, the polycrystalline silicon and the metal are alloyed to form the metal silicide. It is preferred that the metal is not only alloyed with polycrystalline silicon but also with silicon of the exposed portion of the substrate to form a metal silicide layer partly buried in the substrate.

According to the present invention, since the metal silicide layer covers not only the exposed portion of the silicon substrate but also the inner wall of the contact hole, the inner wall need not be etched by an etchant to remove the residual metal. Therefore, any portion of the silicon substrate need not be subsequently exposed. A wiring metal layer or a reaction preventing metal layer need not directly contact the silicon substrate in the contact hole, so that the parallel diode neet not be formed, unlike with the conventional method. Thus, a Schottky barrier diode with the excellent forward characteristic and the good reproducibility is obtained. Further, since a guard ring need not be formed, a highly integrated SBD can be manufactured.

According to one embodiment of the present invention, the polycrystalline silicon layer contains an impurity of the one conductivity type. The impurity is then diffused in the silicon substrate to form a diffusion layer of a high impurity concentration therein. The polycrystalline silicon layer is converted to the metal silicide layer as mentioned above. The fundamental concept lying in the IEEE article in which the barrier height $\phi B$ is controlled to control the forward characteristics of the SBD is realized in a different manner. Further, according to this embodiment of the present invention, the drawback of the method in the article can be eliminated, because the barrier height $\phi B$ is controlled by the concentration of the impurity in the polycrystalline silicon layer, eliminating the necessity of annealing to cure the damage to the substrate. Even though a heat treatment is performed to alloy the polycrystalline silicon with the metal in the present invention, the heating temperature is not so high as to change the profile of the impurity as diffused from the polycrystalline silicon in the silicon substrate.

BRIEF DESCRIPTION OF THE DRAWINGS

FIGS. 1A to 1E are sectional views for explaining the steps of manufacturing a Schottky barrier diode (SBD) according to one embodiment of the present invention;

FIGS. 2 to 4 are sectional views of SBDs manufactured by methods according to other embodiments of the present invention;

FIGS. 5A and 5B are sectional views for explaining the steps of manufacturing an SBD according to still another embodiment of the present invention; and FIG. 6 is a graph for explaining the relative positional relationships between a metal silicide/silicon interface and an impurity profile in the SBD manufactured by the method described with reference to FIGS. 5A and 5B.

DETAILED DESCRIPTION OF THE PREFERRED EMBODIMENTS

The present invention will be described in detail with reference to the accompanying drawings. The same reference numerals denote the same or similar parts throughout the drawings.

Referring to FIG. 1A, a silicon dioxide film 12 as an insulating film is formed on an n-type silicon substrate or layer 11 having an impurity concentration of, for example, $10^{15}$ to $10^{17}$ cm$^{-3}$. The silicon dioxide film 12 is selectively etched by hydrofluoric acid to form a contact hole 13. Thus, the surface of the silicon substrate 11 is partially exposed.

As shown in FIG. 1B, a polycrystalline silicon layer 14 of 500 to 2,000 Å thickness is formed to cover the silicon dioxide film 12, the inner wall of the contact hole 13 and the exposed surface portion of the substrate 11.

Subsequently, as shown in FIG. 1C, the polycrystalline silicon layer 14 on the film 12 is selectively etched to remain only on the surrounding portion of the contact hole 13 on the silicon dioxide film 12. Thereafter, a metal layer 15 which can be converted to a silicide, such as platinum (most preferable), palladium and nickel is formed by vapor deposition to cover the entire surface. The metal layer 15 has a thickness enough to convert the polycrystalline silicon layer 14 into a corresponding metal silicide layer. Preferably, the metal layer 15 has a thickness sufficient to convert a surface layer of the exposed portion of the silicon substrate 11 as well as the polycrystalline silicon layer 14 to the metal silicide. The thickness of the metal layer 15 is easily determined by a simple preliminary experiment. If platinum is used, it is formed preferably to a thickness of 500 to 2,000 Å on the polycrystalline silicon layer of the above-mentioned thickness.

Thereafter, a heat treatment is performed to alloy the polycrystalline silicon with the metal to form the metal silicide, in an inert gas atmosphere such as nitrogen or argon gas at a temperature of about 300° to 700° C. for a predetermined period of time. Alternatively, the alloy may be formed by radiating laser beams or ultraviolet rays.

Polycrystalline silicon is abruptly converted to the metal silicide along the grain boundary of the silicon crystal. The interface between the polycrystalline silicon layer 14 and the silicon substrate 11 which is the greatest grain boundary is also converted to the metal silicide. Further, the wall surface of the contact hole 13 of the silicon substrate 11 is also converted to the metal silicide.

Referring to FIG. 1D, the residual portion of the metal layer 15 remaining as the metal is removed by boiling aqua regia. Thus, the metal silicide layer 16, which rectification-contacts the silicon substrate 11, remains. The metal silicide layer 16 is not only formed on the exposed surface portion of the substrate 11 and in the surface layer thereof but also on the inner wall of the contact hole 13, so that the inner wall of the contact hole 13 may not be etched when the residual portion of the metal layer 15 is etched. Therefore, the silicon substrate 11 may not be subsequently exposed.

Finally, as shown in FIG. 1E, a wiring metal layer 17 is formed to cover the entire surface of the metal silicide layer 16 to prepare a desired Schottky barrier diode. If the metal silicide layer 16 comprises platinum silicide and the wiring metal layer 17 comprises a metallic material such as aluminum or its alloy (e.g., Al—Si or Al—Cu—Si) which reacts with platinum silicide, a layer 21 comprising a reaction preventing metal such as titanium, tungusten or a titanium-tungusten alloy is formed to cover the entire surface of the metal silicide layer 16, and the wiring metal layer 17 is formed thereon, as shown in FIG. 2.

FIG. 3 shows an SBD structure in which a bilayered insulating film is constituted by a silicon dioxide film 31 on the semiconductor substrate 11 and a silicon nitride film 32 formed thereon. With such a multi-layer insulation structure, the SBD becomes highly reliable. For forming a contact hole in the insulating film of the above structure, a hole 13a is formed in the silicon nitride film 32 and then a hole 13b is formed by etching in the silicon dioxide film 31 using the silicon nitride film 32 as a mask. In this process, side etching occurs in the silicon dioxide film 31. Thus, the silicon nitride film 32 is overhung, as shown in the figure. Even if the Schottky barrier metal is directly deposited on the silicon nitride film 32 as in the conventional method described above, the metal cannot be deposited under the overhang, thus providing a poor step coverage. As a result, the high-performance SBD cannot be prepared by the conventional method. However, according to the present invention, polycrystalline silicon can be deposited even under the overhang, thus providing an excellent step coverage. Therefore, a metal can be subsequently uniformly deposited as a continuous layer, and the advantage of the bilayered insulating film can be effectively utilized without degradation of other characteristics.

FIG. 4 shows an SBD structure in which a second insulating film 41 is formed to cover the peripheral portion of the metal silicide layer 16 in order to prevent direct contact between the peripheral portion of the metal silicide layer 16 and the wiring metal layer 17. If the peripheral portion especially the edge of the metal silicide layer 16 contacts the wiring metal layer, the wiring metal layer may be overetched by an etchant at the edge of the metal silicide layer 16 due to a contact potential difference by the contact described above during patterning of the wiring metal layer. The second insulating film 41 prevents the contact between the edge of the metal silicide layer 16 and the wiring metal layer and hence the abnormal overetching, thus allowing micropatterning. The second insulating layer 41 may comprise silicon dioxide deposited by the chemical vapor deposition method or silicon nitride deposited by the plasma deposition method. A hole 42 defined by the second insulating film 41 may be slightly larger or smaller than the contact hole 13. The insulating film 41 may also be, of course, applied to the structures shown in FIGS. 2 and 3.

In any of the embodiments shown in FIGS. 1A to 1E and FIGS. 2 to 4, the polycrystalline silicon layer 14 may comprise n-type impurity-doped polycrystalline silicon. After the polycrystalline silicon layer 14 is formed by the method described with reference to FIG. 1B, an n-type impurity such as arsenic 51 may be ion-implanted in the polycrystalline silicon layer 14 at a concentration of $1 \times 10^{11}$ cm$^{-2}$ to $1 \times 10^{14}$ cm$^{-2}$, as shown in FIG. 5A.

A heat treatment is then performed to activate the doped arsenic ions at a temperature of, for example, about 900° C. Simultaneously, arsenic in the doped polycrystalline silicon layer 14' is diffused into a surface layer of the silicon substrate 11 to form a shallow n$^+$-type diffusion layer 52 of preferably about 100 to 500 Å thickness, as shown in FIG. 5B. Thereafter, the polycrystalline silicon is converted to the metal silicide according to the steps described with reference to FIGS. 1C and 1D. For these steps, process conditions such as the thickness of the polycrystalline silicon layer, the thickness of the metal layer, the diffusion depth of the impurity from the doped polycrystalline silicon layer, and the alloying temperature and time are determined so that the metal silicide/silicon interface may be located within the profile of the impurity diffused into the silicon substrate 11, as shown in FIG. 6. In practice, the exemplified conditions described above are suitable. The alloying temperature is not so high as to change the profile of the impurity diffused from the doped polycrystalline silicon layer 14' into the silicon substrate 11. The impurity profile is thus substantially maintained. According to this embodiment, if the impurity concentration in the doped polycrystalline silicon layer 14' is changed, the barrier height $\phi B$ can be changed, whereby the forward characteristics of the SBD can be freely controlled. The subsequent steps in this embodiment are the same as those described with reference to FIGS. 1D and 1E, or FIGS. 2 to 4.

What is claimed is:

1. A method for manufacturing a Schottky barrier diode, comprising the steps of:

forming an insulating film on a silicon substrate of one conductivity type, said insulating film having a hole partially exposing the surface of said silicon substrate;

forming a layer of polycrystalline silicon containing an impurity of said one conductivity type to cover a portion of said insulating film surrounding said hole, an inner wall of said hole and the exposed surface portion of said silicon substrate;

depositing a layer of a Schottky barrier formation metal to cover at least said polycrystalline silicon layer; and alloying said polycrystalline silicon with said Schottky barrier formation metal to form a metal silicide layer which rectification-contacts said silicon substrate.

2. A method according to claim 1, further including the step of forming a wiring metal layer on said metal silicide layer.

3. A method according to claim 2, wherein said Schottky barrier formation metal is alloyed also with a surface silicon of said substrate.

4. A method according to claim 3, wherein the alloying is performed by heating in an inert gas atmosphere.

5. A method according to claim 1, wherein said insulating film comprises a silicon dioxide film on said silicon substrate and a silicon nitride film on said silicon dioxide film.

6. A method according to claim 2, further including the step of forming a second insulating film to cover an edge portion of said metal silicide layer.

7. A method according to claim 2, further including the step of forming a second metal layer for preventing a reaction of said metal silicide with said wiring metal layer.

8. A method according to claim 7, wherein said metal silicide layer comprises platinum silicide, said wiring metal layer comprises aluminum or an alloy thereof, and said second metal layer comprises a member selected from the group consisting of titanium, tungsten, and a titanium-tungsten alloy.

9. A method according to one of claims 1 through 8, wherein said impurity is ion-implanted into said polycrystalline silicon layer.

10. A method according to one of claims 1 through 8, further comprising the step of forming, prior to the alloy formation, a diffusion layer in the surface of said silicon substrate by diffusing the impurity from said polycrystalline silicon layer into said silicon substrate.

11. A method according to claim 10, wherein an interface between said metal silicide layer and said silicon substrate is located within said diffusion layer.

12. A method according to claim 11, wherein said one conductivity type is an n-conductivity type, and said impurity is arsenic.

13. A method for manufacturing a Schottky barrier diode, comprising the steps of:

forming an insulating film on a silicon substrate of one conductivity type, said insulating film having a hole partially exposing the surface of said silicon substrate and said insulating film having a layered structure comprising a first layer and a second layer formed on and overhanging said first layer;

forming a layer of polycrystalline silicon containing an impurity of said one conductivity type to cover a portion of said insulating film surrounding said hole, an inner wall of said hole and the exposed surface portion of said silicon substrate;

depositing a layer of a Schottky barrier formation metal to cover at least said polycrystalline silicon layer; and alloying said polycrystalline silicon with said Schottky barrier formation metal to form a metal silicide layer which rectification-contacts said silicon substrate.

14. A method as in claim 13, wherein said first layer of said insulating film comprises silicon dioxide.

15. A method as in claim 13, wherein said second layer of said insulating film comprises silicon nitride.

* * * * *